United States Patent
Yao et al.

(10) Patent No.: US 12,372,590 B2
(45) Date of Patent: Jul. 29, 2025

(54) DEVICE AND METHOD FOR TESTING CRIMPING STATUS OF HARDWARE FITTING AND CABLE CONDUCTORS

(71) Applicant: Huaneng Power International Inc. Hebei Clean Energy Branch, Hebei (CN)

(72) Inventors: Hongbin Yao, Hebei (CN); Jingxu Zhang, Hebei (CN); Yuan Tian, Hebei (CN)

(73) Assignee: Huaneng Power International Inc. Hebei Clean Energy Branch, Shijiazhuang (CN)

( * ) Notice: Subject to any disclaimer, the term of this patent is extended or adjusted under 35 U.S.C. 154(b) by 221 days.

(21) Appl. No.: 18/460,249

(22) Filed: Sep. 1, 2023

(65) Prior Publication Data

US 2024/0077548 A1 Mar. 7, 2024

(30) Foreign Application Priority Data

Sep. 1, 2022 (CN) .......................... 202211069242.7

(51) Int. Cl.
  *G01R 31/66* (2020.01)
  *G01R 27/02* (2006.01)

(52) U.S. Cl.
  CPC .............. *G01R 31/66* (2020.01); *G01R 27/02* (2013.01)

(58) Field of Classification Search
  CPC ................ G01R 1/0408; G01R 1/0416; G01R 31/2808; G01R 31/2818; G01R 31/66; G01R 27/02; G01R 31/69; G01N 19/00; G01N 27/4062; G01N 29/0609
  See application file for complete search history.

(56) References Cited

U.S. PATENT DOCUMENTS

| 5,197,186 A * | 3/1993 | Strong | B30B 15/14 29/748 |
|---|---|---|---|
| 2002/0130669 A1* | 9/2002 | Ishibashi | G01R 31/66 324/538 |
| 2015/0047189 A1* | 2/2015 | Stull | H01R 43/0486 29/863 |
| 2015/0168479 A1* | 6/2015 | Gutierrez Martinez | G01R 31/69 324/538 |
| 2021/0119397 A1* | 4/2021 | Dubler | G01R 31/69 |

FOREIGN PATENT DOCUMENTS

| CN | 201669119 U | 12/2010 |
|---|---|---|
| CN | 105277794 A | 1/2016 |
| CN | 108761248 A | 11/2018 |
| CN | 110146439 A | 8/2019 |
| CN | 214121922 U | 9/2021 |

* cited by examiner

*Primary Examiner* — Son T Le

(57) ABSTRACT

Disclosed is a device and method for testing a crimping status of a hardware fitting and cable conductors. The device includes a device body, a cable fixing assembly is arranged on an insulation console and configured to fix a crimping status test piece on the insulation console. According to the present disclosure, technical problems are solved: the existing device for testing a crimping status of a hardware fitting and cable conductors lacks of a fixing assembly, if an operator touches a test piece being tested, the connection between the test piece and a current generator or a contact resistance tester is likely to be interrupted, resulting in a large error in a test result.

10 Claims, 5 Drawing Sheets

DEVICE AND METHOD FOR TESTING CRIMPING STATUS OF HARDWARE FITTING AND CABLE CONDUCTORS

CROSS-REFERENCE TO RELATED APPLICATIONS

This application claims priority of Chinese Patent Application No. 202211069242.7, filed on Sep. 1, 2022, the entire contents of which are incorporated herein by reference.

TECHNICAL FIELD

The present disclosure relates to the technical field of cable crimping, in particular to a device and method for testing a crimping status of a hardware fitting and cable conductors.

BACKGROUND

A device for testing a crimping status of a hardware fitting and cable conductors is a device for detecting the crimping quality between the cable conductors and the hardware fitting.

When the existing device for testing a crimping status of a hardware fitting and cable conductors is used for testing the crimping status of a test piece, because of lack of a fixing assembly, the test piece is movably placed on a console. If an operator touches a test piece being tested, the connection between the test piece and a current generator or a contact resistance tester is likely to be interrupted, resulting in a large error in a test result.

SUMMARY

The present disclosure provides a device and method for testing a crimping status of a hardware fitting and cable conductors to solve the technical problems set forth in the above background.

In order to solve the above technical problem, the present disclosure provides a device and method for testing a crimping status of a hardware fitting and cable conductors, the device including a device body. An insulation console is slidably connected to an interior of the device body, a cable fixing assembly is arranged on the insulation console and configured to fix a crimping status test piece on the insulation console, and a current generator and a contact resistance tester are arranged on the device body.

Preferably, the crimping status test piece includes a first cable, a second cable and a hardware fitting, a first cable conductor of the first cable and a second cable conductor of the second cable being crimped in the hardware fitting.

Preferably, the insulation console is connected to the interior of the device body in a left-right sliding way, and a lighting assembly is connected to the device body in an up-down sliding way.

Preferably, the cable fixing assembly includes:
adaptive adjustment chutes, the adaptive adjustment chutes being disposed on the insulation console;
a connection frame body, the connection frame body being slidably connected into the adaptive adjustment chutes, one end of the connection frame body being fixedly connected to a first fixing block, and the other end of the connection frame body being fixedly connected to a second fixing block; and
an adjustable elastic belt, one end of the adjustable elastic belt being fixedly connected to the first fixing block, the other end of the adjustable elastic belt passing through the second fixing block, and an elastic belt fixing nail body being fixedly connected to the second fixing block.

Preferably, moving assemblies are arranged at a bottom of the device body, the moving assemblies including:
L-shaped lifting support plates, the L-shaped lifting support plate being connected to the interior of the device body in an up-down sliding way, a first linear motor being fixedly connected to the L-shaped lifting support plate, and one end of the first linear motor away from the L-shaped lifting support plate being located at the interior of the device body; and
universal wheels, universal wheel guide rods being arranged at the interior of the device body, the universal wheel being slidably connected to the universal wheel guide rod, second linear motors being fixedly connected to an inner wall of the device body, and a working end of the second linear motor being fixedly connected to the universal wheel.

Preferably, a test piece rejection assembly is arranged at the interior of the device body, the test piece rejection assembly including:
a driving rotary shaft, a starting gear and a ram gear, the driving rotary shaft being rotatably connected to an interior of a first mounting cavity of the device body, and the starting gear and the ram gear being fixedly connected to the driving rotary shaft;
a ram rack and a ram, the ram being fixedly connected to the ram rack, the ram rack being slidably connected to front and rear side walls of the first mounting cavity, and one end of the ram away from the ram rack being located at an interior of a second mounting cavity of the device body;
a driving cam, the driving cam being fixedly connected to the driving rotary shaft;
a mounting block, the mounting block being fixedly connected to the interior of the first mounting cavity, a first guide rod being fixedly connected to the mounting block, a first guide cylinder being connected to the first guide rod in an up-down sliding way, a first rod and a second rod being fixedly connected to the first guide cylinder, a push plate being fixedly connected to the first rod and configured to cooperate with the driving cam, and the first guide rod being sleeved with a first elastic piece;
a second guide rod and a second guide cylinder, the second guide rod being fixedly connected to the interior of the first mounting cavity, the second guide cylinder being slidably connected to the second guide rod, the second guide rod being sleeved with a second elastic piece, a positioning clamping block being fixedly connected to the second guide cylinder and configured to cooperate with one end of the second rod away from the first guide cylinder;
a console body, the console body being fixedly connected to the interior of the first mounting cavity, a conversion gear mounting seat being fixedly connected to the console body, a conversion gear being rotatably connected to the conversion gear mounting seat, and a conversion rack being slidably connected to the console body, engaged to the conversion gear, and fixedly connected to the second guide cylinder via a curved rod;
a guide cylinder, the guide cylinder being fixedly connected to the mounting block, an engagement rod body being slidably connected to an interior of the guide cylinder, a third elastic piece being fixedly connected to the engagement rod body and an inner wall of the guide cylinder, a plug being fixedly connected to one end of the engagement rod body away from the third elastic piece; and an unqualified test piece storage cylinder, the unqualified test piece storage cylinder being connected to the interior of the second mounting cavity in an up-down sliding way, a cylinder slider being fixedly connected to the unqualified test piece storage cylinder and connected to an inner wall of the second mounting cavity via a fourth elastic piece, and a plug connection hole being arranged on the unqualified test piece storage cylinder and configured to cooperate with the plug.

Preferably, the device further includes:

a hinge cover body, the hinge cover body being rotatably connected to a bottom of the unqualified test piece storage cylinder, and a first driving piece being arranged on the hinge cover body and configured to drive the hinge cover body to rotate;

a Z-shaped bolt, the Z-shaped bolt being slidably connected to the unqualified test piece storage cylinder, one end of the Z-shaped bolt located in the unqualified test piece storage cylinder being engaged with a Z-shaped bolt driving gear, a second driving piece being arranged on the Z-shaped bolt driving gear and configured to drive the Z-shaped bolt driving gear to rotate, and one end of the Z-shaped bolt located outside the unqualified test piece storage cylinder being configured to cooperate with an end surface of the hinge cover body; and a weight sensor, the weight sensor being arranged in the hinge cover body and being configured to detect the weight of an unqualified crimping status test piece in the unqualified test piece storage cylinder, the weight sensor being electrically connected to the first driving piece and the second driving piece, and a cleaning channel being disposed at a bottom of the second mounting cavity.

A method for testing a crimping status of a hardware fitting and cable conductors includes the following steps:

step one: inserting a first cable conductor of a first cable and a second cable conductor of a second cable into a hardware fitting, and applying pressure to outer walls of the hardware fitting via a crimping device to complete the crimping of the first cable conductor, the second cable conductor and the hardware fitting to form a crimping status test piece, the crimping manner of the crimping device including any one of a pit-press crimping manner or a surrounding-press crimping manner;

step two: connecting two ends of a current generator to one end of the first cable away from the hardware fitting and one end of the second cable away from the hardware fitting via wires to form a closed test loop;

step three: connecting two clamping heads of a contact resistance tester to two ends of the hardware fitting, the contact resistance tester being configured to measure a contact resistance at a position where the hardware fitting is connected to the first cable conductor and the second cable conductor;

step four: performing a current-applying temperature rise test on the test loop via the current generator, and measuring and recording a temperature change at the position where the hardware fitting is connected to the first cable conductor and the second cable conductor;

step five: measuring the contact resistance at the position where the hardware fitting is connected to the first cable conductor and the second cable conductor again via the contact resistance tester; and step six: determining a crimping status of the crimping status test piece based on detection results from steps three to five via a determination module on the device body.

Preferably, the performing a current-applying temperature rise test on the test loop via the current generator, and measuring and recording a temperature change at the position where the hardware fitting is connected to the first cable conductor and the second cable conductor includes:

S1: taking two points spaced a certain distance apart as detection points on the hardware fitting, a detection point a and a detection point b, arranging a first temperature sensor and a second temperature sensor at the detection point a and the detection point b, respectively, the first temperature sensor being configured to detect a temperature at the detection point a, and the second temperature sensor being configured to detect a temperature at the detection point b; and S2: sequentially applying n currents with different intensities to the test loop via the current generator, and recording detection values of the first temperature sensor and the second temperature sensor every 20 minutes when each current is applied.

Preferably, the determination module is electrically connected to the first temperature sensor, the second temperature sensor, the contact resistance tester and the current generator, and the determining a crimping status of the crimping status test piece based on detection results from steps three to five via a determination module on the device body includes the following steps:

S3: calculating an actual crimping poor state coefficient output by the determination module when an $n^{th}$ current is applied into the test loop:

$$\varphi I_n = \sum_{i=1}^{i=\frac{th}{20}} \frac{\left|T_{aI_n(i+1)} - T_{aI_n i}\right|\left|T_{bI_n(i+1)} - T_{bI_n i}\right|}{\Delta T_{aI_n} * \Delta T_{bI_n}} \tag{1}$$

$$e^{\left|\sqrt{R_1^2 + R_2^2 + R_3^2} + \frac{\left|T_{aI_n(i+1)} + T_{bI_n(i+1)} - T_{aI_n i} - T_{bI_n i}\right|}{2}\gamma - R_0\right|}$$

where $\varphi_{I_n}$ is the actual crimping poor state coefficient output by the determination module when the $n^{th}$ current is applied into the test loop, th is a total energizing time of the $n^{th}$ current applied into the test loop, 20 represents a 20-minute time interval, $T_{aI_n(i+1)}$ is a detection value of the first temperature sensor at an $i+1^{st}$ recording when the $n^{th}$ current is applied into the test loop, $T_{aI_n i}$ is a detection value of the first temperature sensor at an $i^{th}$ recording when the $n^{th}$ current is applied into the test loop, $T_{bI_n(i+1)}$ is a detection value of the second temperature sensor at the $i+1^{st}$ recording when the $n^{th}$ current is applied into the test loop, $T_{bI_n i}$ is a detection value of the second temperature sensor at the $i^{th}$ recording when the $n^{th}$ current is applied into the test loop, $\Delta T_{aI_n}$ is a maximum preset temperature change value of the detection point a when the $n^{th}$ current is applied into the test loop, $\Delta T_{bI_n}$ is a maximum preset temperature change value of the detection point b when the $n^{th}$ current is applied into the test loop, e is a natural number with a value of 2.71, $R_{I_n}$ is a detection value of the contact resistance tester (105) in step five when the $n^{th}$ current is applied into the test loop, $R_0$ is a detection value of the contact resistance tester in step three, $R_1$ is an actual resistance of the first cable conductor in the hardware fitting, $R_2$ is an actual resistance of the second cable conductor in the hardware fitting, $R_3$ is an actual resistance of the hardware fitting, and $\gamma$ is a change rate of a resistance at the position where the hardware fitting is connected to the first cable conductor and the second cable conductor with a temperature, that is, each degree of temperature rise corresponds to an incremental value of the resistance at the position where the hardware fitting is connected to the first cable conductor and the second cable conductor; and S4: determining whether the crimping of the first cable conductor, the second cable conductor and the hardware fitting at a crimping position is qualified:

$$\delta = \beta \sum\nolimits_{n=1}^{n=x} \frac{\varphi_{I_n}}{\varphi_{I_{n0}}} \qquad (2)$$

where $\delta$ is a comprehensive crimping qualification constant of the first cable conductor, the second cable conductor and the hardware fitting, $\beta$ is a determination error coefficient of the determination module, x is the number of current intensities applied into the test loop via the current generator, and $\varphi_{I_{n0}}$ is a reference crimping poor state coefficient of the crimping position of the first cable conductor, the second cable conductor and the hardware fitting when the $n^{th}$ current is applied into the test loop; and $$W = \begin{cases} 0, \delta \geq \frac{x}{2} + \forall \\ 1, 0 \leq \delta < \frac{x}{2} + \forall \end{cases} \qquad (3)$$

where $\forall$ is a compensation constant, if W=0, it is proved that the crimping at the crimping position of the first cable conductor, the second cable conductor and the hardware fitting is unqualified, and at this moment, the crimping status test piece is unqualified; and if W=1, it is proved that the crimping at the crimping position of the first cable conductor, the second cable conductor and the hardware fitting is qualified, and at this moment, the crimping status test piece is qualified.

The technical solutions of the present disclosure will be further described in detail through the attached drawings and examples.

BRIEF DESCRIPTION OF THE DRAWINGS

The attached drawings are to provide a further understanding of the present disclosure and constitute a part of the specification, and together with the examples of the present disclosure, serve to explain the present disclosure, but do not constitute a limitation of the present disclosure. In the attached drawings.

DETAILED DESCRIPTION

Preferred examples of the present disclosure will be described below with reference to the attached drawings, and it is to be understood that the preferred examples described here are only used to illustrate and explain the present disclosure, and are not used to limit the present disclosure.

In addition, in the present disclosure, descriptions such as "first" and "second" are only used for descriptive purposes, and do not specifically refer to order or sequence and are not used to define the present disclosure, which are only used to distinguish components or operations described in the same technical terms, and cannot be understood as indicating or implying relative importance or implicitly indicating the number of indicated technical features. Thus, a feature limited as "first" or "second" can explicitly or implicitly include at least one of the features. In addition, the technical solutions and technical features between various examples can be combined with each other, but it must be based on what can be realized by those of ordinary skill in the art. When the combination of technical solutions is contradictory or impossible to realize, it is to be considered that the combination of technical solutions does not exist and is not within the scope of protection required by the present disclosure.

The present disclosure provides the following examples.

Example 1

Figure 1:
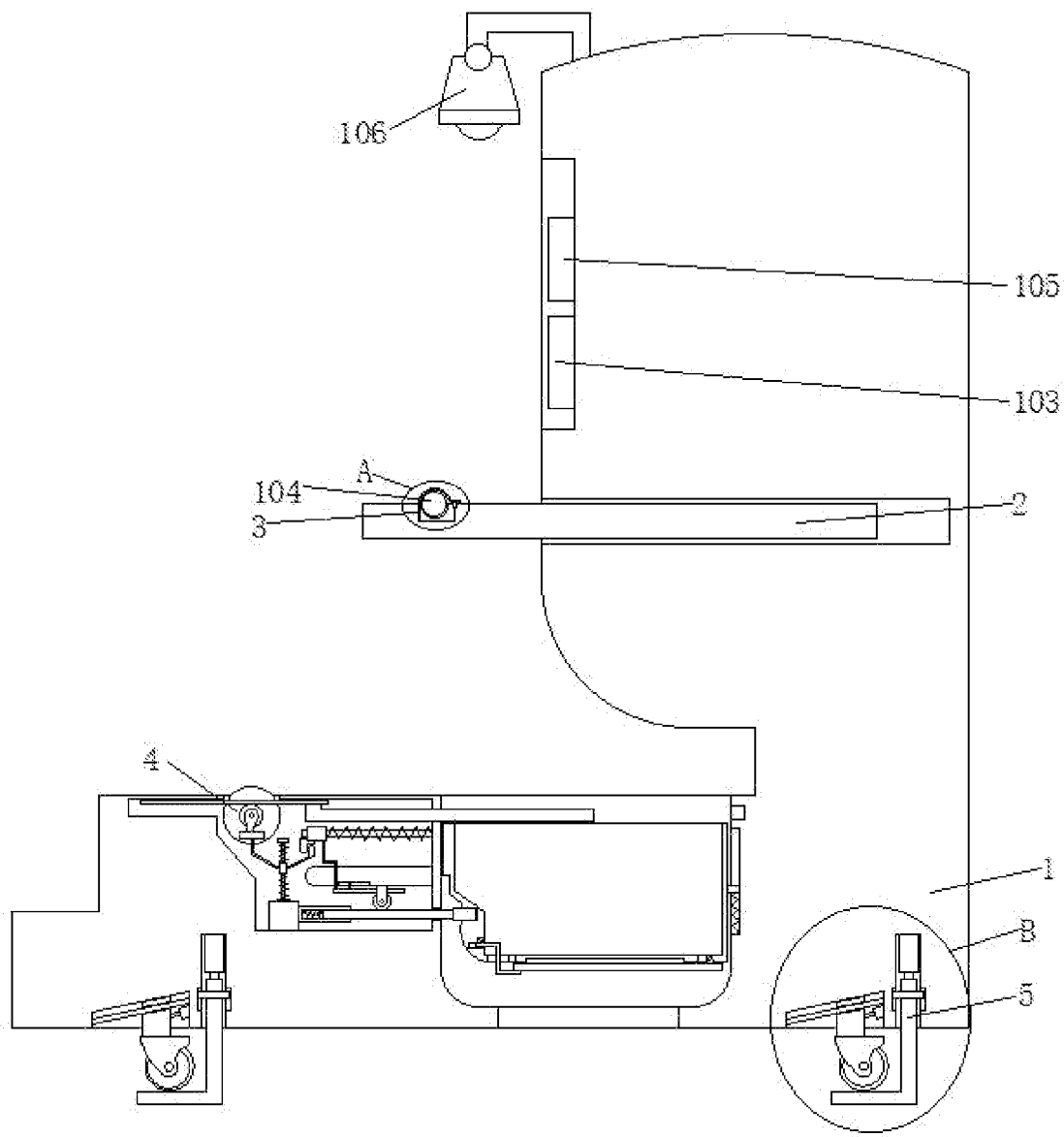
FIG. 1 is a schematic view of an overall structure according to the present disclosure.
Figure 2:
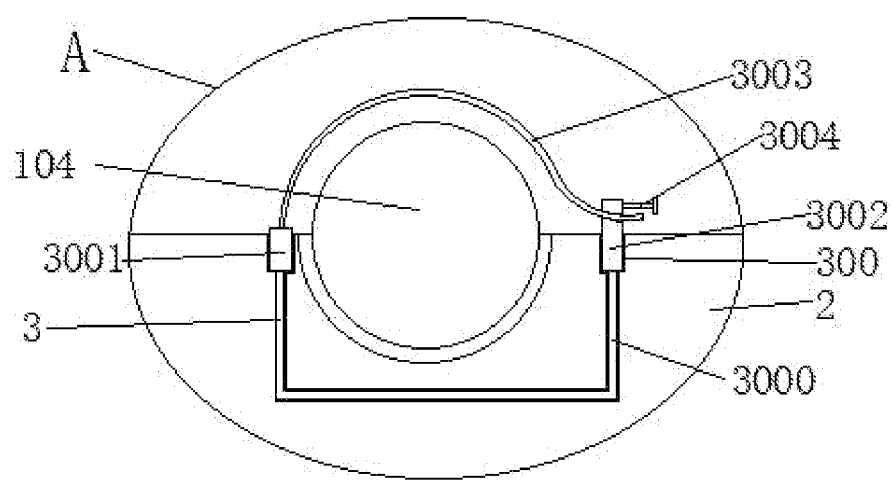
FIG. 2 is a partially enlarged view at A of FIG. 1 according to the present disclosure.
Figure 3:
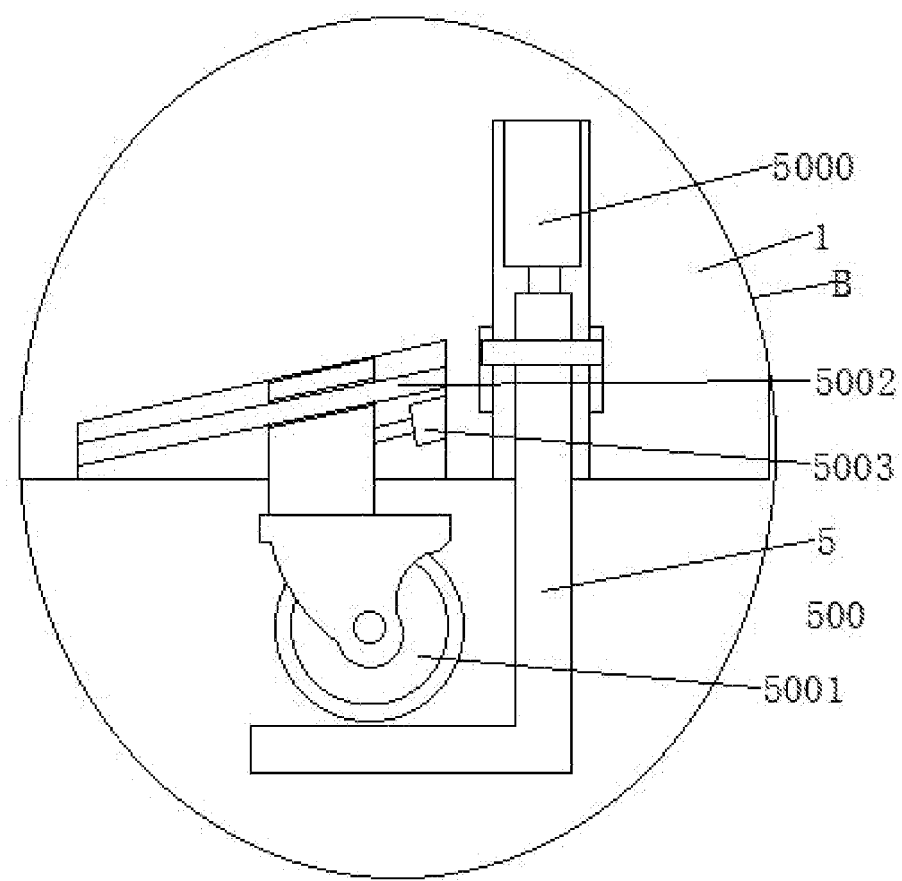
FIG. 3 is a partially enlarged view at B of FIG. 1 according to the present disclosure.
Figure 4:
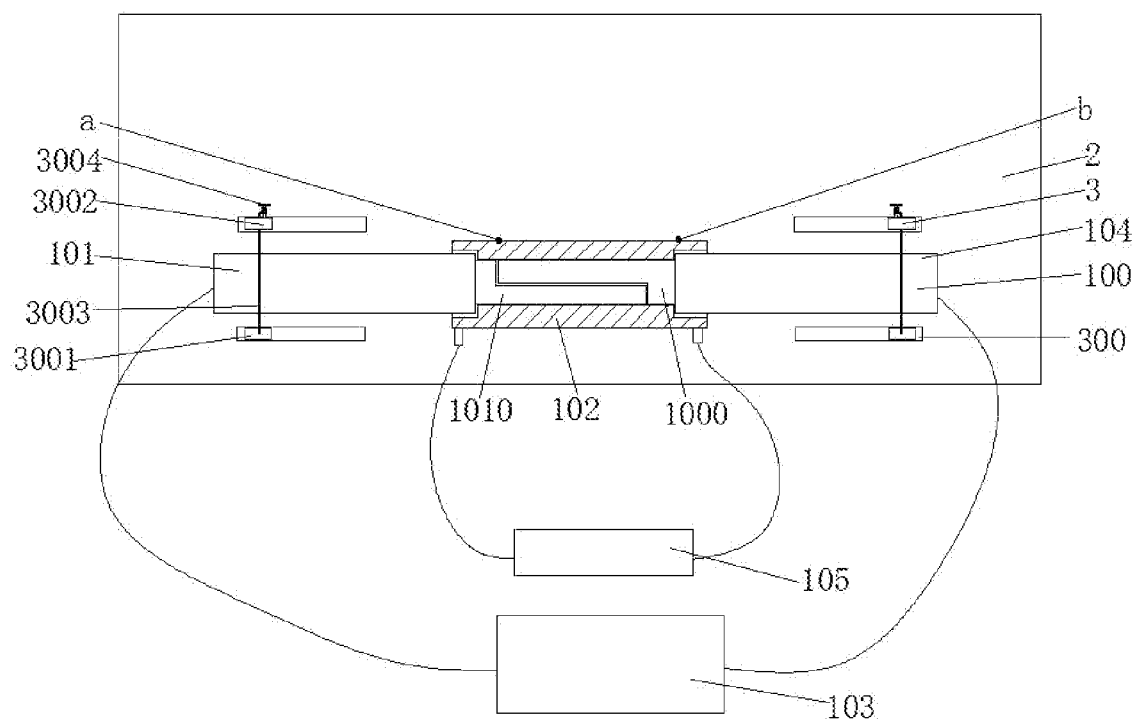
FIG. 4 is a schematic structural view of a cable fixing assembly according to the present disclosure.
Figure 5:
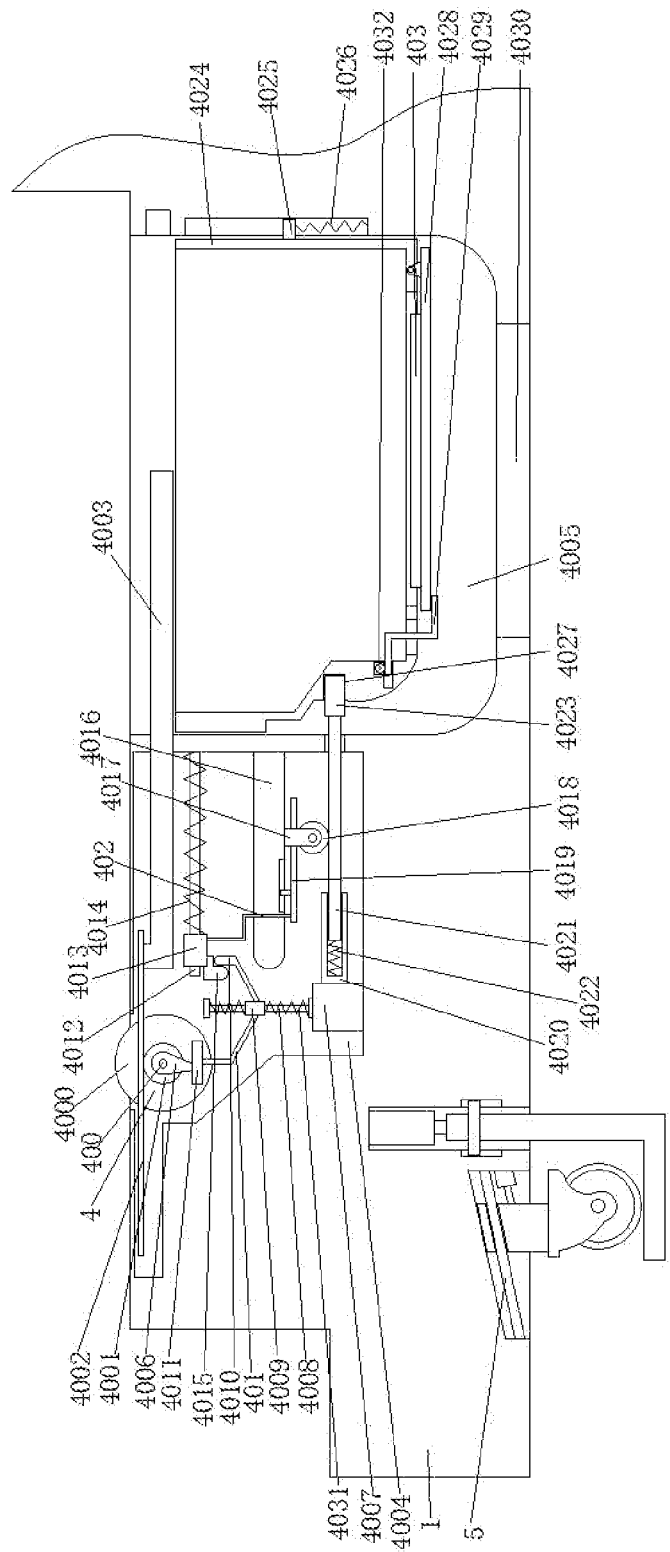
FIG. 5 is a schematic structural view of a test piece rejection assembly according to the present disclosure.

An example of the present disclosure provides a device for testing a crimping status of a hardware fitting and cable conductors, as shown in FIGS. 1-5, including a device body 1. An insulation console 2 is slidably connected to an interior of the device body 1, a cable fixing assembly 3 is arranged on the insulation console 2 and configured to fix a crimping status test piece 104 on the insulation console 2, and a current generator 103 and a contact resistance tester 105 are arranged on the device body 1.

A method for testing a crimping status of a hardware fitting and cable conductors includes the following steps.

At step one: a first cable conductor 1000 of a first cable 100 and a second cable conductor 1010 of a second cable 101 are inserted into a hardware fitting 102, and pressure is applied to outer walls of the hardware fitting 102 via a crimping device to complete the crimping of the first cable conductor 1000, the second cable conductor 1010 and the hardware fitting 102 to form a crimping status test piece 104, the crimping manner of the crimping device including any one of a pit-press crimping manner or a surrounding-press crimping manner.

At step two: two ends of a current generator 103 are connected to one end of the first cable 100 away from the hardware fitting 102 and one end of the second cable 101 away from the hardware fitting 102 via wires to form a closed test loop.

At step three: two clamping heads of a contact resistance tester 105 are connected to two ends of the hardware fitting 102. The contact resistance tester 105 is configured to measure a contact resistance at a position where the hardware fitting 102 is connected to the first cable conductor 1000 and the second cable conductor 1010.

At step four: a current-applying temperature rise test is performed on the test loop via the current generator 103, and a temperature change at the position where the hardware fitting 102 is connected to the first cable conductor 1000 and the second cable conductor 1010 is measured and recorded.

At step five: the contact resistance at the position where the hardware fitting 102 is connected to the first cable conductor 1000 and the second cable conductor 1010 is measured again via the contact resistance tester 105.

At step six: a crimping status of the crimping status test piece 104 is determined based on detection results from steps three to five via a determination module on the device body 1.

The working principles and beneficial effects of the above technical solution are as follows. When the device for testing a crimping status of hardware fitting and cable conductors is in use, the crimping status test piece 104 is fixed on the insulation console 2 via the cable fixing assembly 3, then the contact resistance at the position where the hardware fitting 102 is connected to the first cable conductor 1000 and the second cable conductor 1010 is measured via the contact resistance tester 105, the current-applying temperature rise test is performed on the crimping status test piece 104 via the current generator 103, and the crimping quality of the crimping status test piece 104 is determined according to the test results. By determination of the crimping quality, the problem of excessive crimping resistance and heating at the conductor connection position caused by an improper crimping mode is reduced or avoided, to reduce the probability of line fault and reduce the power failure loss caused by line fault.

According to the present disclosure, the technical problems are solved: when the existing device for testing a crimping status of a hardware fitting and cable conductors is used for testing the crimping status of a test piece, because of lack of a fixing assembly, the test piece is movably placed on the console. If an operator touches a test piece being tested, the connection between the test piece and the current generator or the contact resistance tester is likely to be interrupted, resulting in a large error in a test result.

Example 2

On the basis of the above Example 1, the crimping status test piece 104 includes a first cable 100, a second cable 101 and a hardware fitting 102. A first cable conductor 1000 of the first cable 100 and a second cable conductor 1010 of the second cable 101 are crimped in the hardware fitting 102.

The insulation console 2 is connected to the interior of the device body 1 in a left-right sliding way, and a lighting assembly 106 is connected to the device body 1 in an up-down sliding way.

The cable fixing assembly 3 includes:
adaptive adjustment chutes 300, the adaptive adjustment chutes 300 being disposed on the insulation console 2;
a connection frame body 3000, the connection frame body 3000 being slidably connected into the adaptive adjustment chutes 300, one end of the connection frame body 3000 being fixedly connected to a first fixing block 3001, and the other end of the connection frame body 3000 being fixedly connected to a second fixing block 3002; and
an adjustable elastic belt 3003, one end of the adjustable elastic belt 3003 being fixedly connected to the first fixing block 3001, the other end of the adjustable elastic belt 3003 passing through the second fixing block 3002, and an elastic belt fixing nail body 3004 being fixedly connected to the second fixing block 3002.

Moving assemblies 5 are arranged at a bottom of the device body 1, the moving assemblies 5 including:
L-shaped lifting support plates 500, the L-shaped lifting support plate 500 being connected to the interior of the device body 1 in an up-down sliding way, a first linear motor 5000 being fixedly connected to the L-shaped lifting support plate 500, and one end of the first linear motor 5000 away from the L-shaped lifting support plate 500 being located at the interior of the device body 1; and
universal wheels 5001, universal wheel guide rods 5002 being arranged at the interior of the device body 1, the universal wheel 5001 being slidably connected to the universal wheel guide rod 5002, second linear motors 5003 being fixedly connected to an inner wall of the device body 1, and a working end of the second linear motor 5003 being fixedly connected to the universal wheel 5001.

The working principles and beneficial effects of the above technical solution are as follows. When in use, the insulation console 2 is pulled out from the device body 1, and when the crimping status test piece 104 is fixed on the insulation console 2 via the cable fixing assembly 3, according to an actual length of the crimping status test piece 104, the connection frame body 3000 is manually pushed to slide along the adaptive adjustment chute 300 to a suitable position, and then the adjustable elastic belt 3003 crosses the circumference of the crimping status test piece 104, passes through the second fixing block 3002, and is tightened and fixed on the elastic belt fixing nail body 3004, thereby fixing the crimping status test piece 104 on the insulation console 2.

When it is required to move the device body 1, the second linear motor 5003 extends, drives the universal wheels 5001 to slide to the right along the universal wheel guide rods 5002, and at the same time, the first linear motors 5000 drive the L-shaped lifting support plates 500 to move upwards, so that the universal wheels 5001 contact the ground, and then the device body 1 is pushed to move to a designated position.

Example 3

On the basis of Example 1 or 2, a test piece rejection assembly 4 is arranged at the interior of the device body 1, the test piece rejection assembly 4 including:
a driving rotary shaft 400, a starting gear 4000 and a ram gear 4001, the driving rotary shaft 400 being rotatably connected to an interior of a first mounting cavity 4004 of the device body 1, and the starting gear 4000 and the ram gear 4001 being fixedly connected to the driving rotary shaft 400;
a ram rack 4002 and a ram 4003, the ram 4003 being fixedly connected to the ram rack 4002, the ram rack 4002 being slidably connected to front and rear side walls of the first mounting cavity 4004, and one end of the ram 4003 away from the ram rack 4002 being located at an interior of a second mounting cavity 4005 of the device body 1;
a driving cam 4006, the driving cam 4006 being fixedly connected to the driving rotary shaft 400;
a mounting block 4007, the mounting block 4007 being fixedly connected to the interior of the first mounting cavity 4004, a first guide rod 4008 being fixedly connected to the mounting block 4007, a first guide cylinder 4009 being connected to the first guide rod 4008 in an up-down sliding way, a first rod 401 and a second rod 4010 being fixedly connected to the first guide cylinder 4009, a push plate 4011 being fixedly connected to the first rod 401 and configured to cooperate with the driving cam 4006, and the first guide rod 4008 being sleeved with a first elastic piece 4031;

a second guide rod 4012 and a second guide cylinder 4013, the second guide rod 4012 being fixedly connected to the interior of the first mounting cavity 4004, the second guide cylinder 4013 being slidably connected to the second guide rod 4012, the second guide rod 4012 being sleeved with a second elastic piece 4014, a positioning clamping block 4015 being fixedly connected to the second guide cylinder 4013 and configured to cooperate with one end of the second rod 4010 away from the first guide cylinder 4009;

a console body 4016, the console body 4016 being fixedly connected to the interior of the first mounting cavity 4004, a conversion gear mounting seat 4017 being fixedly connected to the console body 4016, and a conversion gear 4018 being rotatably connected to the conversion gear mounting seat 4017, a conversion rack 4019 being slidably connected to the console body 4016, engaged to the conversion gear 4018, and fixedly connected to the second guide cylinder 4013 via a curved rod 402;

a guide cylinder 4020, the guide cylinder 4020 being fixedly connected to the mounting block 4007, an engagement rod body 4021 being slidably connected to an interior of the guide cylinder 4020, a third elastic piece 4022 being fixedly connected to the engagement rod body 4021 and an inner wall of the guide cylinder 4020, and a plug 4023 being fixedly connected to one end of the engagement rod body 4021 away from the third elastic piece 4022; and an unqualified test piece storage cylinder 4024, the unqualified test piece storage cylinder 4024 being connected to the interior of the second mounting cavity 4005 in an up-down sliding way, a cylinder slider 4025 being fixedly connected to the unqualified test piece storage cylinder 4024 and connected to an inner wall of the second mounting cavity 4005 via a fourth elastic piece 4026, and a plug connection hole 4027 being arranged on the unqualified test piece storage cylinder 4024 and configured to cooperate with the plug 4023. The device further includes:

a hinge cover body 4028, the hinge cover body 4028 being rotatably connected to a bottom of the unqualified test piece storage cylinder 4024, and a first driving piece being arranged on the hinge cover body 4028 and configured to drive the hinge cover body 4028 to rotate;

a Z-shaped bolt 4029, the Z-shaped bolt 4029 being slidably connected to the unqualified test piece storage cylinder 4024, one end of the Z-shaped bolt 4029 located in the unqualified test piece storage cylinder 4024 being engaged with a Z-shaped bolt driving gear 4032, a second driving piece being arranged on the Z-shaped bolt driving gear 4032 and configured to drive the Z-shaped bolt driving gear 4032 to rotate, and one end of the Z-shaped bolt 4029 located outside the unqualified test piece storage cylinder 4024 being configured to cooperate with an end surface of the hinge cover body 4028; and a weight sensor 403, the weight sensor 403 being arranged in the hinge cover body 4028 and being configured to detect the weight of an unqualified crimping status test piece 104 in the unqualified test piece storage cylinder 4024, the weight sensor 403 being electrically connected to the first driving piece and the second driving piece, and a cleaning channel 4030 being disposed at a bottom of the second mounting cavity 4005.

The working principles of the above technical solution are as follows. When the test piece rejection assembly 4 runs, the starting gear 4000 is pushed to rotate by the foot of a worker, the starting gear 4000 rotates to drive the driving rotary shaft 400 to rotate, the driving rotary shaft 400 rotates to drive the ram gear 4001 to rotate, the ram gear 4001 rotates to drive the ram rack 4002 to move, the ram rack 4002 moves to drive the ram 4003 to move to the left, and the ram 4003 moves to the left so that the top of the second mounting cavity 4005 is opened. The driving cam 4006 is driven to rotate during the rotation of the driving rotary shaft 400, the driving cam 4006 pushes the push plate 4011 to move downwards, the push plate 4011 moves downwards to drive the first rod 401 to move downwards, and the first rod 401 moves downwards to drive the first guide cylinder 4009 to move downwards along the first guide rod 4008. During the downward movement of the first guide cylinder 4009, the second rod 4010 moves downwards, the second rod 4010 moves downwards to disengage from the cooperation with the positioning clamping block 4015, so that the second guide cylinder 4013 moves to the left along the second guide rod 4012 under the action of the second elastic piece 4014; the second guide cylinder 4013 moves to the left to drive the conversion rack 4019 to move to the left, the conversion rack 4019 moves to the left to drive the conversion gear 4018 to rotate, the conversion gear 4018 rotates to drive the engagement rod body 4021 to move to the left, the engagement rod body 4021 moves to the left to drive the plug 4023 to disengage from the cooperation with the plug connection hole 4027, then the unqualified test piece storage cylinder 4024 moves upwards under the action of the fourth elastic piece 4026, and an operator throws the unqualified crimping status test piece 104 which needs to be removed into the unqualified test piece storage cylinder 4024.

Then the operator presses the unqualified test piece storage cylinder 4024 downwards; when the unqualified test piece storage cylinder 4024 passes through the plug 4023, after the ultrasonic sensor 4033 detects the unqualified test piece storage cylinder 4024, the third driving piece drives the engagement rod body 4021 to move to the right, and the engagement rod body 4021 moves to the right so that the plug 4023 cooperates with the plug connection hole 4027 again; and at the same time, the engagement rod body 4021 moves to the right to drive the conversion gear 4018 to rotate, the conversion gear 4018 rotates to drive the conversion rack 4019 to move to the left, the conversion rack 4019 moves to the left to drive the second guide cylinder 4013 to move to the left, and then the starting gear 4000 is manually reversely rotated, so that the driving cam 4006 is disengaged from the abutting fit with the push plate 4011, the first guide cylinder 4009 moves upwards under the action of the first elastic piece 4031, and the second rod 4010 cooperates with the positioning clamping block 4015 again.

When the accumulated weight of the unqualified crimping status test piece 104 in the unqualified test piece storage cylinder 4024 exceeds a preset weight, that is, the actual detection value of the weight sensor 403 exceeds a preset value, the second driving piece drives the Z-shaped bolt driving gear 4032 to rotate, the Z-shaped bolt driving gear 4032 drives the Z-shaped bolt 4029 to move to the left, so that the Z-shaped bolt 4029 is disengaged from the cooperation with the end face of the hinge cover body 4028; and then the first driving piece drives the hinge cover body 4028 to rotate, and the hinge cover body 4028 rotates so that the unqualified crimping status test piece 104 is discharged out of the unqualified test piece storage cylinder 4024 via the cleaning channel 4030.

Example 4

On the basis of Example 1, the performing a current-applying temperature rise test on the test loop via the current generator 103, and measuring and recording a temperature change at the position where the hardware fitting 102 is connected to the first cable conductor 1000 and the second cable conductor 1010 includes the following steps.

At S1: two points spaced a certain distance apart are taken as detection points on the hardware fitting 102, a detection point a and a detection point b, a first temperature sensor and a second temperature sensor are arranged at the detection point a and the detection point b, respectively. The first temperature sensor is configured to detect a temperature at the detection point a, and the second temperature sensor is configured to detect a temperature at the detection point b.

At S2: n currents with different intensities are sequentially applied to the test loop via the current generator 103, and detection values of the first temperature sensor and the second temperature sensor are recorded every 20 minutes when each current is applied.

The determination module is electrically connected to the first temperature sensor, the second temperature sensor, the contact resistance tester 105 and the current generator 103, and the determining a crimping status of the crimping status test piece 104 based on detection results from steps three to five via a determination module on the device body 1 includes the following steps.

At S3: an actual crimping poor state coefficient output by the determination module when an $n^{th}$ current is applied into the test loop is calculated:

$$\varphi I_n = \sum_{i=1}^{i=\frac{th}{20}} \frac{|T_{aI_n(i+1)} - T_{aI_n i}||T_{bI_n(i+1)} - T_{bI_n i}|}{\Delta T_{aI_n} * \Delta T_{bI_n}} \qquad (1)$$

$$e^{\left|\sqrt{R_1^2 + R_2^2 + R_3^2} + \frac{T_{aI_n(i+1)} + T_{bI_n(i+1)} - T_{aI_n i} - T_{bI_n i}}{2} \gamma - R_0\right|}$$

where $\varphi_{I_n}$ is the actual crimping poor state coefficient output by the determination module when the $n^{th}$ current is applied into the test loop, th is a total energizing time of the $n^{th}$ current applied into the test loop, 20 represents a 20-minute time interval, $T_{aI_n(i+1)}$ is a detection value of the first temperature sensor at an $i+1^{st}$ recording when the $n^{th}$ current is applied into the test loop, $T_{aI_n i}$ is a detection value of the first temperature sensor at an ii recording when the $n^{th}$ current is applied into the test loop, $T_{bI_n(i+1)}$ is a detection value of the second temperature sensor at the $i+1^{st}$ recording when the $n^{th}$ current is applied into the test loop, $T_{bI_n i}$ is a detection value of the second temperature sensor at the $i^{th}$ recording when the $n^{th}$ current is applied into the test loop, $\Delta T_{aI_n}$ is a maximum preset temperature change value of the detection point a when the $n^{th}$ current is applied into the test loop, $\Delta T_{bI_n}$ is a maximum preset temperature change value of the detection point b when the $n^{th}$ current is applied into the test loop, e is a natural number with a value of 2.71, $R_{I_n}$ is a detection value of the contact resistance tester 105 in step five when the $n^{th}$ current is applied into the test loop, $R_0$ is a detection value of the contact resistance tester 105 in step three, $R_1$ is an actual resistance of the first cable conductor 1000 in the hardware fitting 102, $R_2$ is an actual resistance of the second cable conductor 1010 in the hardware fitting 102, $R_3$ is an actual resistance of the hardware fitting 102, and $\gamma$ is a change rate of a resistance at the position where the hardware fitting 102 is connected to the first cable conductor 1000 and the second cable conductor 1010 with a temperature, that is, each degree of temperature rise corresponds to an incremental value of the resistance at the position where the hardware fitting 102 is connected to the first cable conductor 1000 and the second cable conductor 1010.

At S4: whether the crimping of the first cable conductor 1000, the second cable conductor 1010 and the hardware fitting 102 at a crimping position is qualified is determined:

$$\delta = \beta \sum_{n=1}^{n=x} \frac{\varphi_{I_n}}{\varphi_{I_{n0}}} \qquad (2)$$

where $\delta$ is a comprehensive crimping qualification constant of the first cable conductor 1000, the second cable conductor 1010 and the hardware fitting 102, $\beta$ is a determination error coefficient of the determination module, x is the number of current intensities applied into the test loop via the current generator 103, and $\varphi_{I_{n0}}$ is a reference crimping poor state coefficient of the crimping position of the first cable conductor 1000, the second cable conductor 1010 and the hardware fitting 102 when the $n^{th}$ current is applied into the test loop; and $$W = \begin{cases} 0, \delta \geq \frac{x}{2} + \forall \\ 1, 0 \leq \delta < \frac{x}{2} + \forall \end{cases} \qquad (3)$$

where $\forall$ is a compensation constant, if W=0, it is proved that the crimping at the crimping position of the first cable conductor 1000, the second cable conductor 1010 and the hardware fitting 102 is unqualified, and at this moment, the crimping status test piece 104 is unqualified; and if W=1, it is proved that the crimping at the crimping position of the first cable conductor 1000, the second cable conductor 1010 and the hardware fitting 102 is qualified, and at this moment, the crimping status test piece 104 is qualified.

The working principles and beneficial effects of the above technical solution are as follows. The crimping qualified status of the crimping status test piece 104 is comprehensively determined through the contact resistance value at the position where the hardware fitting 102 is connected to the first cable conductor 1000 and the second cable conductor 1010 and the current-applying temperature rise experiment, so that when an $n^{th}$ current is applied into the test loop, a calculation result of an actual crimping poor state coefficient $\varphi_{I_n}$ output by the determination module is more accurate. When a temperature difference value $|T_{aI_n(i+1)} - T_{aI_n i}|$ between two adjacent records of the detection point a and a temperature difference value $|T_{bI_n(i+1)} - T_{bI_n i}|$ between two adjacent records of the detection point b are large, it is proved that the heating at the position where the hardware fitting 102 is connected to the first cable conductor 1000 and the second cable conductor 1010 is unstable, and the crimping status test piece 104 is unqualified;

$$\delta \geq \frac{x}{2} + \forall$$

proves that in x temperature rise experiments performed by applying x currents with different intensities, the experimental results of more experiments show that an actual crimping poor state coefficient exceeds a reference crimping poor state coefficient, and at this moment, the crimping status test piece 104 is determined as unqualified; and $$0 \leq \delta < \frac{x}{2} + \forall$$

proves that in x temperature rise experiments performed by applying x currents with different intensities, the experimental results of less experiments show that an actual crimping poor state coefficient is less than a reference crimping poor state coefficient, and at this moment, the crimping status test piece 104 is determined as qualified.

Obviously, various modifications and variations of the present disclosure can be made by those skilled in the art without departing from the spirit and scope of the present disclosure. Therefore, provided that these modifications and variations of the present disclosure fall within the scope of the claims of the present disclosure and equivalents thereof, the present disclosure is also intended to include these modifications and variations.

The invention claimed is:

1. A device for testing a crimping status of a hardware fitting and cable conductors, comprising a device body (1), wherein an insulation console (2) is slidably connected to an interior of the device body (1), a cable fixing assembly (3) is arranged on the insulation console (2) and configured to fix a crimping status test piece (104) on the insulation console (2), and a current generator (103) and a contact resistance tester (105) are arranged on the device body (1); and a test piece rejection assembly (4) is arranged at the interior of the device body (1), the test piece rejection assembly (4) comprising:

a driving rotary shaft (400), a starting gear (4000) and a ram gear (4001), the driving rotary shaft (400) being rotatably connected to an interior of a first mounting cavity (4004) of the device body (1), and the starting gear (4000) and the ram gear (4001) being fixedly connected to the driving rotary shaft (400);

a ram rack (4002) and a ram (4003), the ram (4003) being fixedly connected to the ram rack (4002), the ram rack (4002) being slidably connected to front and rear side walls of the first mounting cavity (4004), and one end of the ram (4003) away from the ram rack (4002) being located at an interior of a second mounting cavity (4005) of the device body (1);

a driving cam (4006), the driving cam (4006) being fixedly connected to the driving rotary shaft (400);

a mounting block (4007), the mounting block (4007) being fixedly connected to the interior of the first mounting cavity (4004), a first guide rod (4008) being fixedly connected to the mounting block (4007), a first guide cylinder (4009) being connected to the first guide rod (4008) in an up-down sliding way, a first rod (401) and a second rod (4010) being fixedly connected to the first guide cylinder (4009), a push plate (4011) being fixedly connected to the first rod (401) and configured to cooperate with the driving cam (4006), and the first guide rod (4008) being sleeved with a first elastic piece (4031);

a second guide rod (4012) and a second guide cylinder (4013), the second guide rod (4012) being fixedly connected to the interior of the first mounting cavity (4004), the second guide cylinder (4013) being slidably connected to the second guide rod (4012), the second guide rod (4012) being sleeved with a second elastic piece (4014), a positioning clamping block (4015) being fixedly connected to the second guide cylinder (4013) and configured to cooperate with one end of the second rod (4010) away from the first guide cylinder (4009);

a console body (4016), the console body (4016) being fixedly connected to the interior of the first mounting cavity (4004), a conversion gear mounting seat (4017) being fixedly connected to the console body (4016), a conversion gear (4018) being rotatably connected to the conversion gear mounting seat (4017), and a conversion rack (4019) being slidably connected to the console body (4016), engaged to the conversion gear (4018), and fixedly connected to the second guide cylinder (4013) via a curved rod (402);

a guide cylinder (4020), the guide cylinder (4020) being fixedly connected to the mounting block (4007), an engagement rod body (4021) being slidably connected to an interior of the guide cylinder (4020), a third elastic piece (4022) being fixedly connected to the engagement rod body (4021) and an inner wall of the guide cylinder (4020), a plug (4023) being fixedly connected to one end of the engagement rod body (4021) away from the third elastic piece (4022), an ultrasonic sensor (4033) being fixedly connected to the plug (4023), and a third driving piece being arranged on the engagement rod body (4021) and configured to drive the engagement rod body (4021) to slide along the guide cylinder (4020) and electrically connected to the ultrasonic sensor (4033); and an unqualified test piece storage cylinder (4024), the unqualified test piece storage cylinder (4024) being connected to the interior of the second mounting cavity (4005) in an up-down sliding way, a cylinder slider (4025) being fixedly connected to the unqualified test piece storage cylinder (4024) and connected to an inner wall of the second mounting cavity (4005) via a fourth elastic piece (4026), and a plug connection hole (4027) being arranged on the unqualified test piece storage cylinder (4024) and configured to cooperate with the plug (4023).

2. The device for testing a crimping status of a hardware fitting and cable conductors according to claim 1, wherein the crimping status test piece (104) comprises a first cable (100), a second cable (101) and a hardware fitting (102), a first cable conductor (1000) of the first cable (100) and a second cable conductor (1010) of the second cable (101) being crimped in the hardware fitting (102).

3. The device for testing a crimping status of a hardware fitting and cable conductors according to claim 1, wherein the insulation console (2) is connected to the interior of the device body (1) in a left-right sliding way, and a lighting assembly (106) is connected to the device body (1) in an up-down sliding way.

4. The device for testing a crimping status of a hardware fitting and cable conductors according to claim 1, wherein the cable fixing assembly (3) comprises:
- adaptive adjustment chutes (300), the adaptive adjustment chutes (300) being disposed on the insulation console (2);
- a connection frame body (3000), the connection frame body (3000) being slidably connected into the adaptive adjustment chutes (300), one end of the connection frame body (3000) being fixedly connected to a first fixing block (3001), and the other end of the connection frame body (3000) being fixedly connected to a second fixing block (3002); and
- an adjustable elastic belt (3003), one end of the adjustable elastic belt (3003) being fixedly connected to the first fixing block (3001), the other end of the adjustable elastic belt (3003) passing through the second fixing block (3002), and an elastic belt fixing nail body (3004) being fixedly connected to the second fixing block (3002).

5. The device for testing a crimping status of a hardware fitting and cable conductors according to claim 1, wherein moving assemblies (5) are arranged at a bottom of the device body (1), the moving assemblies (5) comprising:
- L-shaped lifting support plates (500), the L-shaped lifting support plate (500) being connected to the interior of the device body (1) in an up-down sliding way, a first linear motor (5000) being fixedly connected to the L-shaped lifting support plate (500), and one end of the first linear motor (5000) away from the L-shaped lifting support plate (500) being located at the interior of the device body (1); and
- universal wheels (5001), universal wheel guide rods (5002) being arranged at the interior of the device body (1), the universal wheel (5001) being slidably connected to the universal wheel guide rod (5002), second linear motors (5003) being fixedly connected to an inner wall of the device body (1), and a working end of the second linear motor (5003) being fixedly connected to the universal wheel (5001).

6. The device for testing a crimping status of a hardware fitting and cable conductors according to claim 1, further comprising:
- a hinge cover body (4028), the hinge cover body (4028) being rotatably connected to a bottom of the unqualified test piece storage cylinder (4024), and a first driving piece being arranged on the hinge cover body (4028) and configured to drive the hinge cover body (4028) to rotate;
- a Z-shaped bolt (4029), the Z-shaped bolt (4029) being slidably connected to the unqualified test piece storage cylinder (4024), one end of the Z-shaped bolt (4029) located in the unqualified test piece storage cylinder (4024) being engaged with a Z-shaped bolt driving gear (4032), a second driving piece being arranged on the Z-shaped bolt driving gear (4032) and configured to drive the Z-shaped bolt driving gear (4032) to rotate, and one end of the Z-shaped bolt (4029) located outside the unqualified test piece storage cylinder (4024) being configured to cooperate with an end surface of the hinge cover body (4028); and
- a weight sensor (403), the weight sensor (403) being arranged in the hinge cover body (4028) and being configured to detect the weight of an unqualified crimping status test piece (104) in the unqualified test piece storage cylinder (4024), the weight sensor (403) being electrically connected to the first driving piece and the second driving piece, and a cleaning channel (4030) being disposed at a bottom of the second mounting cavity (4005).

7. A method for testing a crimping status of a hardware fitting and cable conductors for performing a crimping status test using a device for testing a crimping status of a hardware fitting and cable conductors according to claim 1, comprising the following steps:
- step one: inserting a first cable conductor (1000) of a first cable (100) and a second cable conductor (1010) of a second cable (101) into a hardware fitting (102), and applying pressure to outer walls of the hardware fitting (102) via a crimping device to complete the crimping of the first cable conductor (1000), the second cable conductor (1010) and the hardware fitting (102) to form a crimping status test piece (104), the crimping manner of the crimping device comprising any one of a pit-press crimping manner or a surrounding-press crimping manner;
- step two: connecting two ends of a current generator (103) to one end of the first cable (100) away from the hardware fitting (102) and one end of the second cable (101) away from the hardware fitting (102) via wires to form a closed test loop;
- step three: connecting two clamping heads of a contact resistance tester (105) to two ends of the hardware fitting (102), the contact resistance tester (105) being configured to measure a contact resistance at a position where the hardware fitting (102) is connected to the first cable conductor (1000) and the second cable conductor (1010);
- step four: performing a current-applying temperature rise test on the test loop via the current generator (103), and measuring and recording a temperature change at the position where the hardware fitting (102) is connected to the first cable conductor (1000) and the second cable conductor (1010);
- step five: measuring the contact resistance at the position where the hardware fitting (102) is connected to the first cable conductor (1000) and the second cable conductor (1010) again via the contact resistance tester (105); and
- step six: determining a crimping status of the crimping status test piece (104) based on detection results from steps three to five via a determination module on the device body (1).

8. A method for testing a crimping status of a hardware fitting and cable conductors for performing a crimping status test using a device for testing a crimping status of a hardware fitting and cable conductors according to claim 2, comprising the following steps:
- step one: inserting a first cable conductor (1000) of a first cable (100) and a second cable conductor (1010) of a second cable (101) into a hardware fitting (102), and applying pressure to outer walls of the hardware fitting (102) via a crimping device to complete the crimping of the first cable conductor (1000), the second cable conductor (1010) and the hardware fitting (102) to form a crimping status test piece (104), the crimping manner of the crimping device comprising any one of a pit-press crimping manner or a surrounding-press crimping manner;
- step two: connecting two ends of a current generator (103) to one end of the first cable (100) away from the hardware fitting (102) and one end of the second cable (101) away from the hardware fitting (102) via wires to form a closed test loop;

step three: connecting two clamping heads of a contact resistance tester (105) to two ends of the hardware fitting (102), the contact resistance tester (105) being configured to measure a contact resistance at a position where the hardware fitting (102) is connected to the first cable conductor (1000) and the second cable conductor (1010);

step four: performing a current-applying temperature rise test on the test loop via the current generator (103), and measuring and recording a temperature change at the position where the hardware fitting (102) is connected to the first cable conductor (1000) and the second cable conductor (1010);

step five: measuring the contact resistance at the position where the hardware fitting (102) is connected to the first cable conductor (1000) and the second cable conductor (1010) again via the contact resistance tester (105); and step six: determining a crimping status of the crimping status test piece (104) based on detection results from steps three to five via a determination module on the device body (1).

9. The method for testing a crimping status of a hardware fitting and cable conductors according to claim 7, wherein the performing a current-applying temperature rise test on the test loop via the current generator (103), and measuring and recording a temperature change at the position where the hardware fitting (102) is connected to the first cable conductor (1000) and the second cable conductor (1010) comprises:

S1: taking two points spaced a certain distance apart as detection points on the hardware fitting (102), a detection point a and a detection point b, arranging a first temperature sensor and a second temperature sensor at the detection point a and the detection point b, respectively, the first temperature sensor being configured to detect a temperature at the detection point a, and the second temperature sensor being configured to detect a temperature at the detection point b; and S2: sequentially applying n currents with different intensities to the test loop via the current generator (103), and recording detection values of the first temperature sensor and the second temperature sensor every 20 minutes when each current is applied.

10. The method for testing a crimping status of a hardware fitting and cable conductors according to claim 8, wherein the determination module is electrically connected to the first temperature sensor, the second temperature sensor, the contact resistance tester (105) and the current generator (103), and the determining a crimping status of the crimping status test piece (104) based on detection results from steps three to five via a determination module on the device body (1) comprises the following steps:

S3: calculating an actual crimping poor state coefficient output by the determination module when an $n^{th}$ current is applied into the test loop:

$$\varphi_{I_n} = \sum_{i=1}^{i=\frac{th}{20}} \frac{|T_{aI_n(i+1)} - T_{aI_n i}||T_{bI_n(i+1)} - T_{bI_n i}|}{\Delta T_{aI_n} * \Delta T_{bI_n}} \quad (1)$$

$$e^{\left|\sqrt{R_1^2 + R_2^2 + R_3^2} + \frac{|T_{aI_n(i+1)} + T_{bI_n(i+1)} - T_{aI_n i} - T_{bI_n i}|}{2}\right|\gamma - R_0|} \cdot \frac{|R_{I_n} - R_0|}{}$$

wherein $\varphi_{I_n}$ is the actual crimping poor state coefficient output by the determination module when the $n^{th}$ current is applied into the test loop, th is a total energizing time of the $n^{th}$ current applied into the test loop, 20 represents a 20-minute time interval, $T_{aI_n(i+1)}$ is a detection value of the first temperature sensor at an $i+1^{st}$ recording when the $n^{th}$ current is applied into the test loop, $T_{aI_n i}$ is a detection value of the first temperature sensor at an $i^{th}$ recording when the $n^{th}$ current is applied into the test loop, $T_{bI_n(i+1)}$ is a detection value of the second temperature sensor at the $i+1^{st}$ recording when the $n^{th}$ current is applied into the test loop, $T_{bI_n i}$ is a detection value of the second temperature sensor at the $i^{th}$ recording when the $n^{th}$ current is applied into the test loop, $\Delta T_{aI_n}$ is a maximum preset temperature change value of the detection point a when the $n^{th}$ current is applied into the test loop, $\Delta T_{bI_n}$ is a maximum preset temperature change value of the detection point b when the $n^{th}$ current is applied into the test loop, e is a natural number with a value of 2.71, $R_{I_n}$ is a detection value of the contact resistance tester (105) in step five when the $n^{th}$ current is applied into the test loop, $R_0$ is a detection value of the contact resistance tester (105) in step three, $R_1$ is an actual resistance of the first cable conductor (1000) in the hardware fitting (102), $R_2$ is an actual resistance of the second cable conductor (1010) in the hardware fitting (102), $R_3$ is an actual resistance of the hardware fitting (102), and $\gamma$ is a change rate of a resistance at the position where the hardware fitting (102) is connected to the first cable conductor (1000) and the second cable conductor (1010) with a temperature, that is, each degree of temperature rise corresponds to an incremental value of the resistance at the position where the hardware fitting (102) is connected to the first cable conductor (1000) and the second cable conductor (1010); and S4: determining whether the crimping of the first cable conductor (1000), the second cable conductor (1010) and the hardware fitting (102) at a crimping position is qualified:

$$\delta = \beta \sum_{n=1}^{n=x} \frac{\varphi_{I_n}}{\varphi_{I_{n0}}} \quad (2)$$

wherein $\delta$ is a comprehensive crimping qualification constant of the first cable conductor (1000), the second cable conductor (1010) and the hardware fitting (102), $\beta$ is a determination error coefficient of the determination module, x is the number of current intensities applied into the test loop via the current generator (103), and $\varphi_{I_{n0}}$ is a reference crimping poor state coefficient of the crimping position of the first cable conductor (1000), the second cable conductor (1010) and the hardware fitting (102) when the $n^{th}$ current is applied into the test loop; and $$W = \begin{cases} 0, \delta \geq \frac{x}{2} + \forall \\ 1, 0 \leq \delta < \frac{x}{2} + \forall \end{cases} \quad (3)$$

wherein $\forall$ is a compensation constant, if W=0, it is proved that the crimping at the crimping position of the first cable conductor (1000), the second cable conductor (1010) and the hardware fitting (102) is unqualified, and at this moment, the crimping status test piece (104) is unqualified; and if W=1, it is proved that the crimping at the crimping position of the first cable conductor (1000), the second cable conductor (1010) and the hardware fitting (102) is qualified, and at this moment, the crimping status test piece (104) is qualified.

\* \* \* \* \*